(12) United States Patent
Singh et al.

(10) Patent No.: US 10,324,235 B2
(45) Date of Patent: Jun. 18, 2019

(54) PARTIAL COATING OF LENSES

(71) Applicant: Valeo North America, Inc., Troy, MI (US)

(72) Inventors: Shivi Singh, Columbus, IN (US); Robert Fraizer, Seymour, IN (US); Thomas Nolan, Paris Crossing, IN (US); Gavin Warner, Seymour, IN (US)

(73) Assignee: Valeo North America, Inc., Troy, MI (US)

( * ) Notice: Subject to any disclaimer, the term of this patent is extended or adjusted under 35 U.S.C. 154(b) by 58 days.

(21) Appl. No.: 15/616,983

(22) Filed: Jun. 8, 2017

(65) Prior Publication Data

US 2018/0356563 A1 Dec. 13, 2018

(51) Int. Cl.
*B32B 3/00* (2006.01)
*G02B 1/12* (2006.01)
*C23C 14/54* (2006.01)
*C23C 14/18* (2006.01)
*C23C 14/35* (2006.01)
*C23C 14/20* (2006.01)
*F21S 43/20* (2018.01)

(52) U.S. Cl.
CPC .............. *G02B 1/12* (2013.01); *C23C 14/185* (2013.01); *C23C 14/205* (2013.01); *C23C 14/35* (2013.01); *C23C 14/54* (2013.01); *F21S 43/26* (2018.01)

(58) Field of Classification Search
CPC ....... C23C 14/34; C23C 14/205; C23C 14/54; G02B 1/10
See application file for complete search history.

(56) References Cited

U.S. PATENT DOCUMENTS

| | | |
|---|---|---|
| 5,010,458 A | 4/1991 | Fraizer |
| 5,931,566 A | 8/1999 | Fraizer |
| 2006/0062004 A1 | 3/2006 | Birman |
| 2010/0035034 A1* | 2/2010 | Yin ..................... C23C 14/0676 428/216 |
| 2015/0330592 A1 | 11/2015 | Olson |
| 2015/0353773 A1* | 12/2015 | Dornseif ................ C23C 14/58 428/35.9 |

* cited by examiner

*Primary Examiner* — Elizabeth E Mulvaney
(74) *Attorney, Agent, or Firm* — Oblon, McClelland, Maier & Neustadt, L.L.P.

(57) ABSTRACT

A coated substrate includes a substrate having a glow-discharged surface; and a coating having a submicrometric layer thickness sputter deposited onto the substrate. The coating having a submicrometric layer thickness has a predetermined absorbance. The predetermined absorbance regulates an amount of light transmitted from a light source through the substrate from a first side to a second side of the substrate. The substrate is opaque on the second side of the substrate when the light source is deactivated on the first side of the substrate. The predetermined absorbance varies as a function of one or more controlled process parameters.

19 Claims, 11 Drawing Sheets

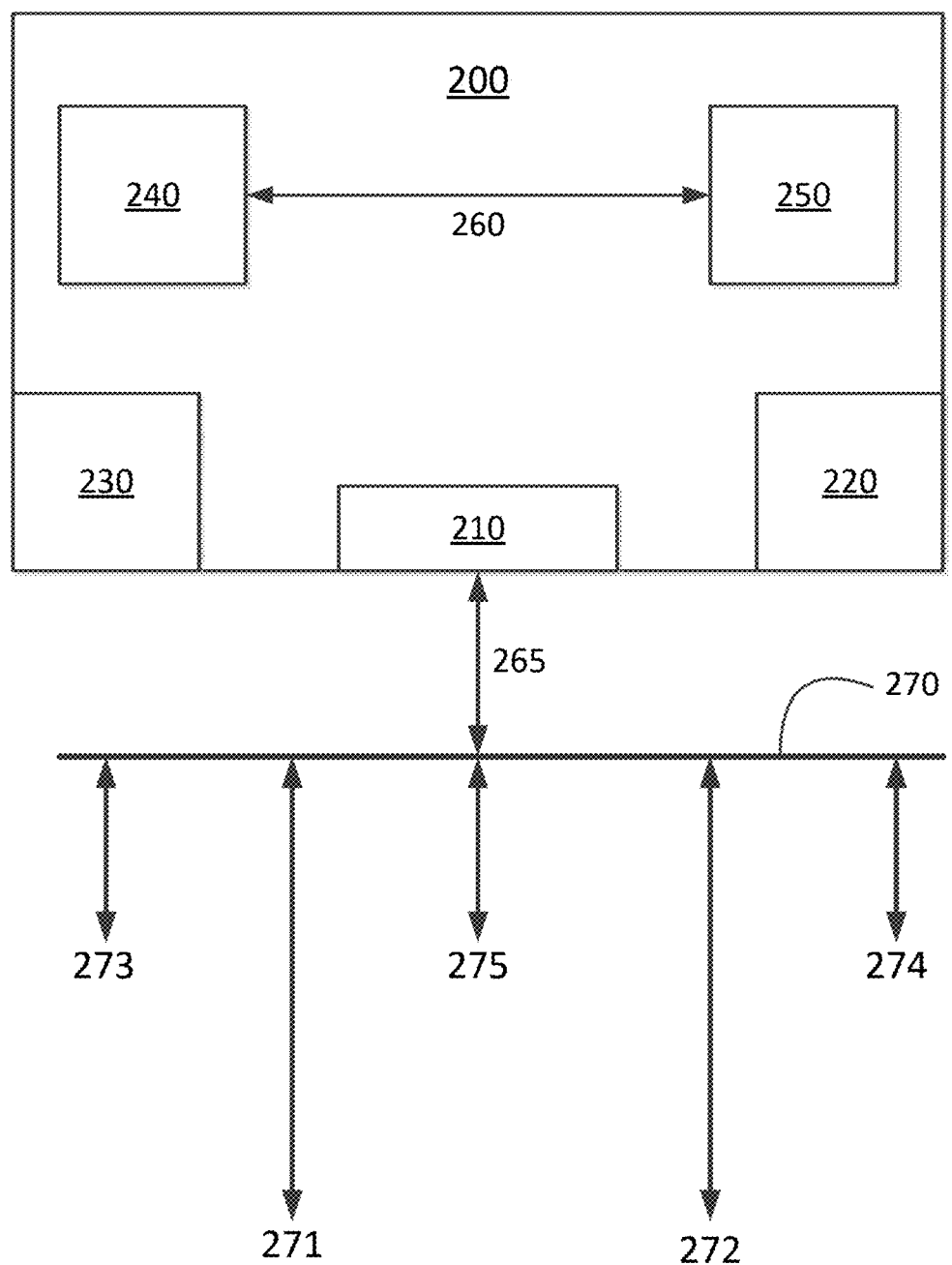

PARTIAL COATING OF LENSES

BACKGROUND

Automotive lamps are becoming more aesthetically inclined. Customers expect a vehicle to have a certain appearance, in addition to being legal and providing functionality. Therefore, manufacturers of automotive lamps need to provide all of these features. However, it can be difficult to satisfy a customer's aesthetic desires and still be legal and functional. For example, a tail lamp can be made of a particular color and design, but light rays still need to travel through the color and design deposited onto a base substrate or lens.

The "background" description provided herein is for the purpose of generally presenting the context of the disclosure. Work of the presently named inventors, to the extent it is described in this background section, as well as aspects of the description which may not otherwise qualify as conventional art at the time of filing, are neither expressly nor impliedly admitted as conventional art against the present disclosure.

SUMMARY

Embodiments described herein include the following aspects.

(1) A method of depositing a coating onto a substrate includes mounting the substrate in a physical vapor deposition (PVD) chamber; sputter depositing a coating having a submicrometric layer thickness onto the substrate in a vacuum sputter deposition process; and controlling one or more process parameters to yield a predetermined absorbance of the sputter-deposited coating on the substrate, wherein the predetermined absorbance regulates an amount of light transmitted from a light source through the substrate from a first side to a second side of the substrate, and the predetermined absorbance causes the substrate to appear opaque on the second side when the light source is deactivated on the first side of the substrate.

(2) The method of depositing a coating onto a substrate of (1), further includes rotating the substrate during the vacuum sputter deposition process; and enabling a glow discharge during the vacuum sputter deposition process.

(3) The method of depositing a coating onto a substrate of either (1) or (2), further includes sputter depositing a metallic coating having a submicrometric layer thickness onto the substrate.

(4) The method of depositing a coating onto a substrate of any one of (1) through (3), further includes sputter depositing a stainless steel coating having a submicrometric layer thickness onto the substrate.

(5) The method of depositing a coating onto a substrate of any one of (1) through (4), wherein the substrate is an outer lens.

(6) The method of depositing a coating onto a substrate of any one of (1) through (5), wherein the process parameters include a power level of a vacuum sputter deposition power source, a gas flow rate, and a deposition time of the vacuum sputter deposition process.

(7) The method of depositing a coating onto a substrate of any one of (1) through (6), wherein one or more of the process parameters determines a color and a degree of absorbance of the substrate.

(8) The method of depositing a coating onto a substrate of any one of (1) through (7), further includes applying a glow discharge to the substrate prior to sputter depositing the coating having a submicrometric layer thickness.

(9) The method of depositing a coating onto a substrate of any one of (1) through (8), further includes masking a portion of the substrate prior to sputter depositing the coating having a submicrometric layer thickness.

(10) The method of depositing a coating onto a substrate of any one of (1) through (9), further includes controlling one or more of the process parameters to provide the coating having a submicrometric layer thickness with a mirror-like appearance on the first side or the second side of the substrate.

(11) The method of depositing a coating onto a substrate of any one of (1) through (10), further includes controlling one or more of the process parameters to provide the coating having a submicrometric layer thickness with a smoke-like appearance on the first side or the second side of the substrate.

(12) The method of depositing a coating onto a substrate of any one of (1) through (11), further includes sputter depositing a protective layer onto the substrate in a PVD process after sputter depositing the coating having a submicrometric layer thickness onto the substrate.

(13) The method of depositing a coating onto a substrate of any one of (1) through (12), wherein the protective layer includes one of hexymethyldisiloxane (HMDSO) or tetramethyldisiloxane (TMDSO).

Embodiments described herein also include a product, which is made by the method described in any one of (1) through (13) above.

(14) A coated substrate, includes a substrate having a glow-discharged surface; and a coating having a submicrometric layer thickness sputter deposited onto the substrate, wherein the coating having a submicrometric layer thickness has a predetermined absorbance, the predetermined absorbance regulates an amount of light transmitted from a light source through the substrate from a first side to a second side of the substrate, the substrate is opaque on the second side of the substrate when the light source is deactivated on the first side of the substrate, and the predetermined absorbance varies as a function of one or more controlled process parameters.

(15) The coated substrate of (14), wherein the process parameters include a power level of a sputter deposition power source, a gas flow rate, and a deposition time of a sputter deposition process.

(16) The coated substrate of either (14) or (15), wherein the coating having a submicrometric layer thickness has a mirror-like appearance on the first side or the second side of the substrate.

(17) The coated substrate of any one of (14) through (16), wherein the coating having a submicrometric layer thickness has a smoke-like appearance on the first side or the second side of the substrate.

(18) The coated substrate of any one of (14) through (17), wherein one or more of the process parameters determine a color and a degree of absorbance of the substrate.

(19) The coated substrate of any one of (14) through (18), wherein the coating having a submicrometric layer thickness is a metallic coating having a submicrometric layer thickness.

(20) The coated substrate of any one of (14) through (19), wherein the having a submicrometric layer thickness coating is a stainless steel coating having a submicrometric layer thickness.

(21) The coated substrate of any one of (14) through (20), wherein the substrate is an outer lens.

(22) The coated substrate of any one of (14) through (21), further includes a patterned coating having a submicrometric layer thickness, wherein portions of the substrate are not covered by the coating having a submicrometric layer thickness.

(23) The coated substrate of any one of (14) through (22), further includes a light-absorbent coating laser ablated to remove areas within the light-absorbent coating to allow light transmission through the substrate from an activated light source.

(24) The coated substrate of any one of (14) through (23), wherein the light-absorbent coating includes one of a laser-ablated pattern or a laser-ablated graphic.

(25) The coated substrate of any one of (14) through (24), wherein a layer thickness of the coating having a submicrometric layer thickness includes a range of 10 nm to 350 nm.

(26) The coated substrate of any one of (14) through (25), wherein one of the controlled process parameters includes a power level range of 1 kW to 60 kW.

(27) The coated substrate of any one of (14) through (26), wherein one of the controlled process parameters includes a processing time range of 3 seconds to 150 seconds.

(28) The coated substrate of any one of (14) through (27), wherein one of the controlled process parameters includes one of an acetylene, nitrogen, or oxygen reactive processing gas.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 4 is a block diagram illustrating a vacuum chamber of a magnetron sputtering apparatus according to one embodiment;

DETAILED DESCRIPTION

Embodiments described herein provide systems of and methods for metallization of a substrate or lens. In particular, embodiments herein describe partial metallization of a lens on an interior or exterior automotive lamp.

The following descriptions are meant to further clarify the present disclosure by giving specific examples and embodiments of the disclosure. These embodiments are meant to be illustrative rather than exhaustive. The full scope of the disclosure is not limited to any particular embodiment disclosed in the specification, but rather is defined by the claims.

In the interest of clarity, not all of the features of the implementations described herein are shown and described in detail. It will be appreciated that in the development of any such actual implementation, numerous implementation-specific decisions will be made in order to achieve the developer's specific goals, such as compliance with application- and business-related constraints, and that these specific goals will vary from one implementation to another and from one developer to another.

Figure 1:
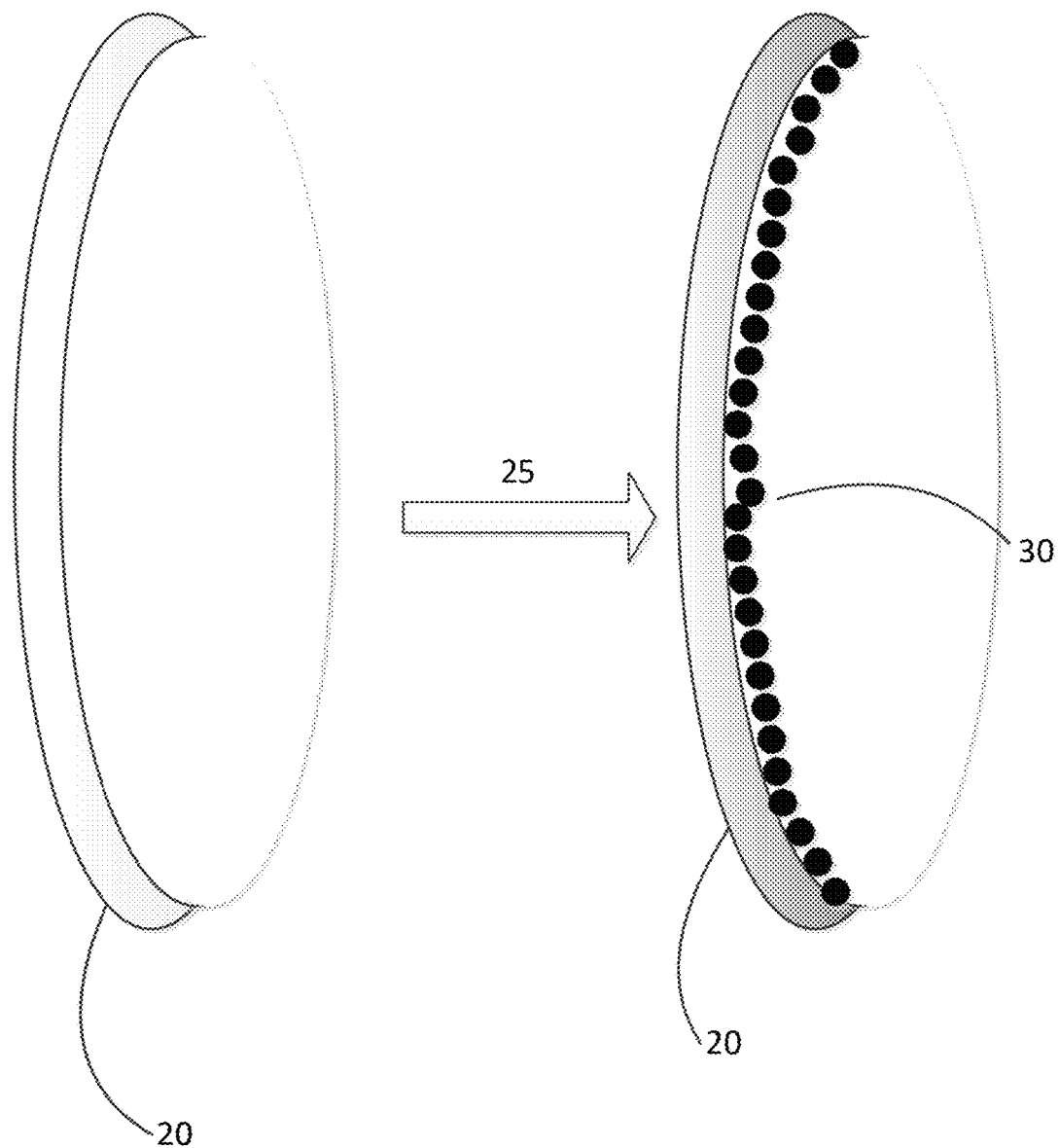
FIG. 1 is an illustration of a partial metallization process according to one embodiment.

FIG. 1 is an illustration of a partial metallization process using embodiments described herein. A lens 20 is provided, in which one or more dyes have been used to produce a tinted lens 20 with a colored hue. However, a clear lens 20 can also be used. The color of the original lens will depend upon the final desired color and light absorbance of the lens 20. The color of the original lens will also be based upon applicable legal requirements for a particular automotive application.

Lens 20 can be any type of exterior lens used in the automotive industry, such as tail lamps, signal lamps, brake lamps, decorative lamps, or perimeter lamps. Lens 20 can also be an interior lens used with automotive interior lighting or dashboard lighting. Lens 20 can be made of polycarbonate or high-temperature polycarbonate, poly-methyl meth-acrylate (PMMA), glass, poly-ethylene terephthalate (PET), etc. Embodiments described herein can manipulate the original color of the lens 20 and the process parameters to yield a desired color, light absorbance, and texture of the final lens 20. In one embodiment, the desired color, light absorbance, and texture can be manipulated to match or complement the interior vehicle décor. A minimum absorbance of the lens 20 is determined in part by the type of lens, such as polycarbonate, PMMA, glass, PET, etc.

Figure 3A:
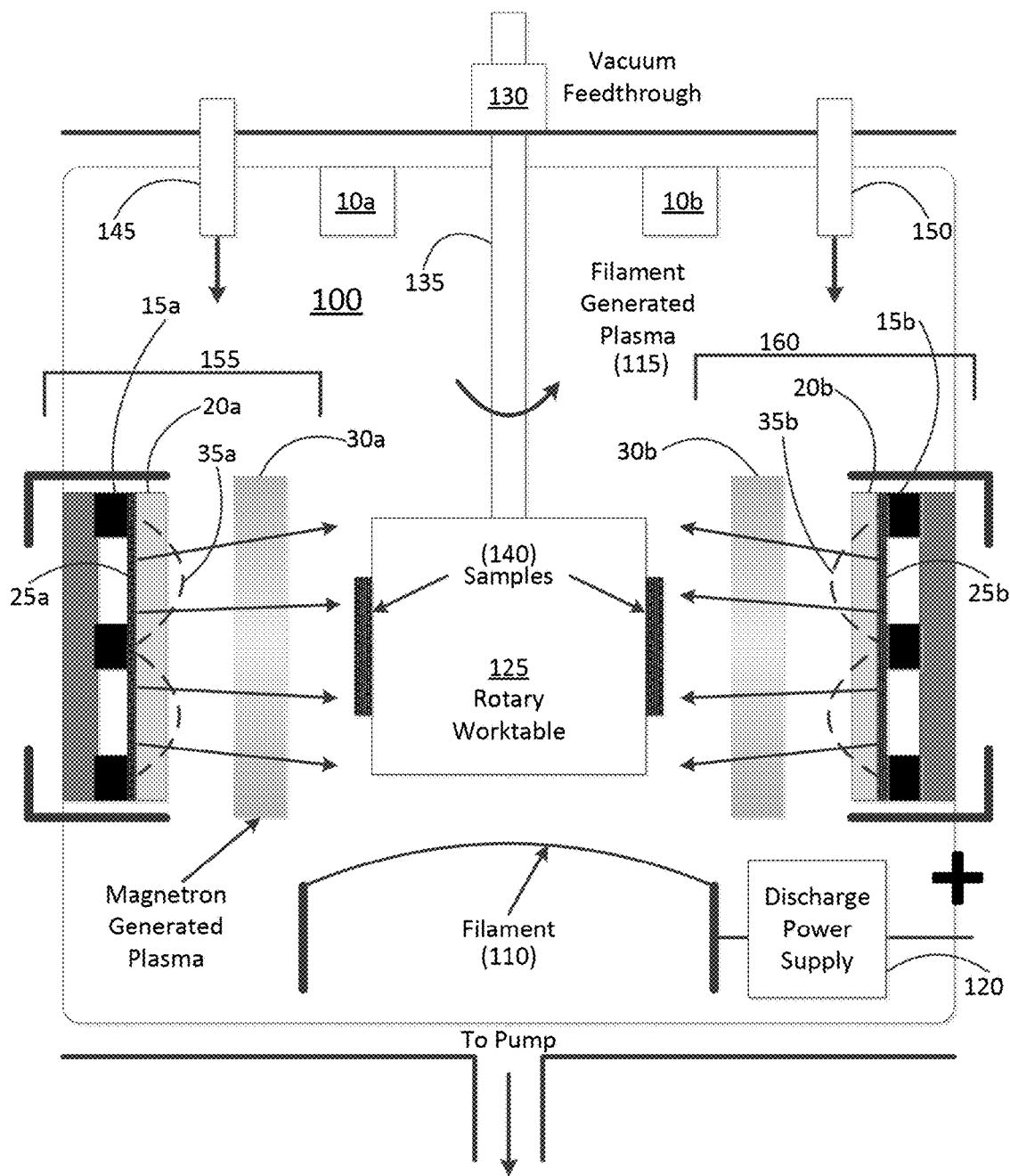
FIG. 3A is a cross-sectional view of an exemplary vacuum chamber of a magnetron sputtering apparatus according to one embodiment.

In a method of coating a lens, substrate, or other part, lens 20 is mounted in a vacuum sputter deposition chamber, such as the vacuum chamber of a magnetron sputtering apparatus described in FIG. 3A. In one embodiment, the lens, substrate, or part is exposed to a glow discharge to clean and roughen the surface of the lens 20 prior to sputter deposition of the submicrometric metallic coating. A partial metallization 25 is sputter-deposited onto the lens 20 to provide a thin submicrometric metallic coating 30 on the lens 20. In one embodiment, stainless steel is deposited onto the lens 20. Other metals and non-metals can be used as a metal target for the sputter-deposited submicrometric metallic coating 30, such as aluminum or titanium. The sputter-deposited submicrometric metallic coating 30 is enlarged for illustrative purposes only. FIG. 1 is not drawn to scale.

Partial metallization of a smoked lens 20 allows the semi-transparent submicrometric coating take the darker appearance from the pigment in the lens. Therefore, the appearance is modified to look darker. For a clear lens, the pigment of the lens is taken strictly from the submicrometric coating.

The partial metallization can also make the appearance mirror-like and shiny. Based on the pigment in the lens 20, different hued appearances can be achieved. The darker and mirror-like appearances of the lens 20 can be achieved without excessively tinting the lens 20, which maintains the consistency and allows most of the light to still transmit through the lens 20.

During the sputter deposition process, various process parameters can be controlled to yield a predetermined light absorbance, as well as a final look or texture of the lens 20.

Process parameters that influence the final appearance of the lens 20 are the power level of the vacuum sputter deposition power source, sputtering gas pressures, and a deposition time of the vacuum sputter deposition process. In general, a shorter period of deposition time and a lower power level of the power source yield a smoke-like appearance, whereas a longer period of deposition time and a higher power level of the power source yield an opaque or mirror-like appearance. A smoke-like appearance can include, but is not limited to a grey-black appearance, a matt-black appearance, and a shiny-black appearance. For example, given for illustrative purposes only, a deposition time of 6 seconds and a power level of 20 kW lead to a smoke-like appearance, while a deposition time of about 9-12 seconds and a power level of 20 kW yield a deep black appearance (with neutral density PMMA substrate). A deposition time of approximately 18-36 seconds and a power level of 20 kW lead to a mirror-like appearance. A thickness of the sputter-deposited submicrometric metallic coating 30 can be in the range of 10-50 nanometers at a processing time of 2-60 seconds. A thickness of the partial metallization can be controlled to achieve a full range of light absorbance from a light absorbance of zero percent to one hundred percent.

The reactive gas used in the sputter-deposition process can also be controlled to yield a specific color and appearance of the lens 20. For example, a titanium target used with acetylene results in a black lens 20. A nitrogen reactive gas used with a titanium target results in an opaque lens 20.

A protective topcoat can also be applied to titanium or aluminum coated lens 20, such as hexymethyldisiloxane (HMDSO) or tetramethyldisiloxane (TMDSO). However, some coatings, such as stainless steel tend to be more robust and may not require a protective coating.

Processing parameters described herein can provide a type of "ghost" lamp appearance. When a light source behind the lens 20 is activated, light passes through the lens. Since the sputter-deposited submicrometric metallic coating 30 is very thin, light can pass through the interstices of the partially metallized coating. However, when the light source is deactivated, the opposite side of the lens 20 appears to be a solid coated layer of metal. Therefore, light can travel from a first interior side through the lens 20 when the light source is activated, but the second exterior side of the lens 20 appears to be opaque when the light source is deactivated. The color and light absorbance of the lens 20 will depend upon the original color of the lens 20 and upon various processing parameters, such as the sputter deposition source power level and the deposition time.

In one embodiment, the sputter-deposited submicrometric metallic coating 30 can be used in a lamp having two lenses 20. The sputter-deposited submicrometric metallic coating 30 can be applied to the outside or inside of an inner lens 20 or it can be applied to the inside of an outer lens 20.

Embodiments described herein can provide a partially-coated lens 20 designed to blend with the vehicle. For example, a chrome lens 20 can be designed to match a chrome bumper or other chrome features on the vehicle. A smoke-like colored lens 20 can be designed to match a darker vehicle.

Since the lens 20 is just partially metallized, the light source can be modified to compensate for the reduction in performance based on the level of light absorbance required on the lamp so it remains a legal lamp. However, the outside appearance of the lamp can blend with the appearance of the surrounding vehicle features. Interior lighting of the vehicle can be enhanced using embodiments described herein. Invisible lighting components with a metallic appearance can be created with interior vehicle lighting. In addition, a broader spectrum of lighting options is possible with interior lighting since there are few or no legal restrictions.

Several advantages can be realized from a one-step metallization process using embodiments described herein. Different undertones can be achieved with different tinted lenses. A metallic satin chrome appearance can be achieved. The partially metalized lens 20 can also hide interior electronics and other internal components of the lamp.

Another advantage of embodiments described herein is creating patterns on the lens 20, which can be achieved by masking the lens 20 prior to sputter depositing the partial metallization 25. When selective areas of the lamp need to be blocked from view, a mask can be used to cover that region of the lens 20. Undesirable or confidential components of the lamp can be blocked from view by masking the undesirable or confidential region. In addition, numerous patterns can be masked to provide a patterned lens 20, especially with interior lighting.

When the lens 20 is masked, a glow discharge process and rotation of the lens 20 during sputter deposition should be exercised. However, the glow discharge process and rotation of the lens 20 can be disabled when no masking is used.

Figure 2:
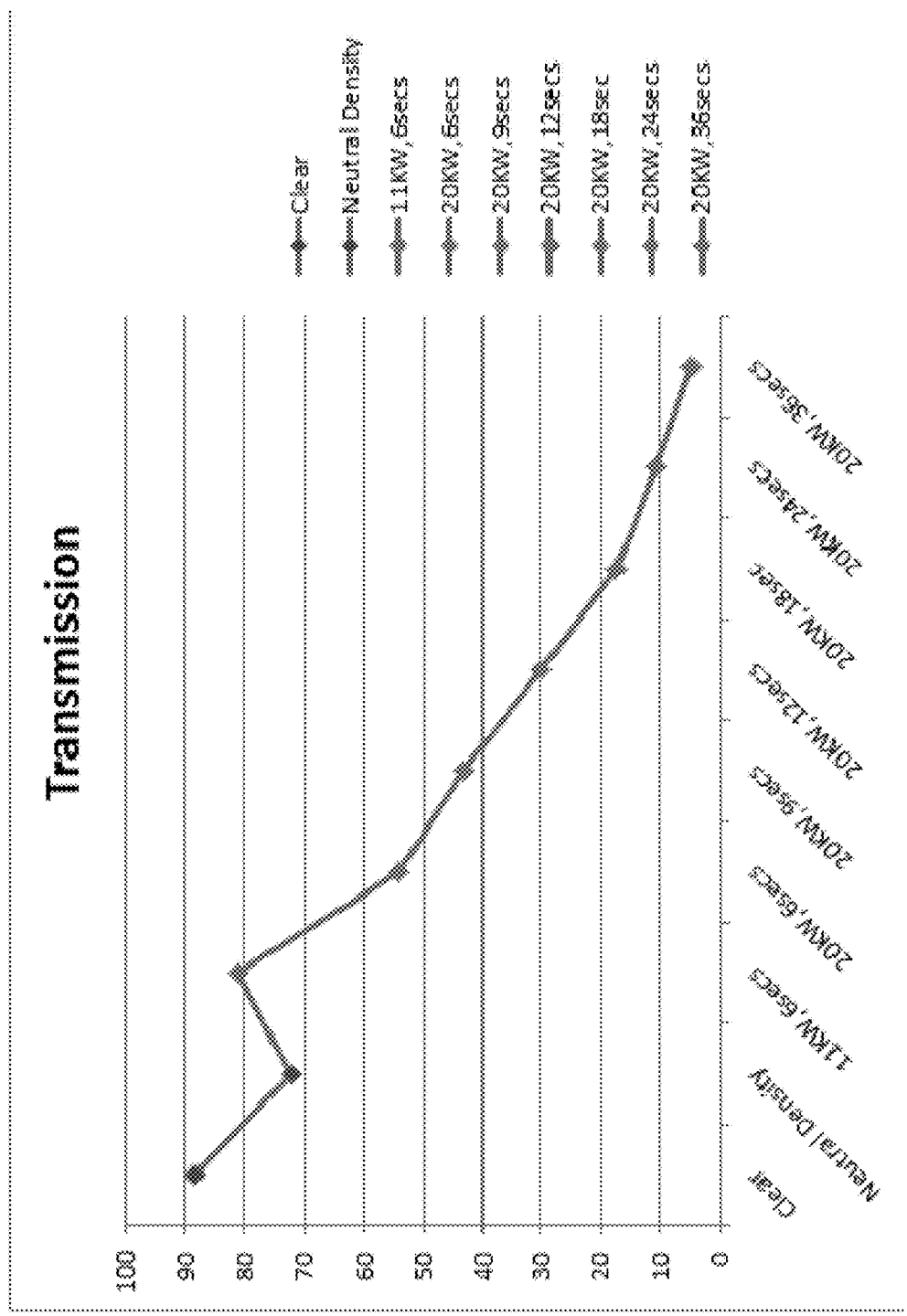
FIG. 2 is a table of process transmissivities according to one embodiment.

FIG. 2 is a graph illustrating the light transmissivities through a lens having a submicrometric stainless steel partial metallization coating at various time and power process parameters. FIG. 2 is given for illustrative purposes only. Other metallic and non-metallic submicrometric coatings using applicable process parameters are contemplated by embodiments described herein. The "clear lens" and the "neutral density lens" do not have a deposited submicrometric layer present. The two lenses are given as a standard transmissivity reference in which to compare the coated lenses. The remaining lenses with time and power process parameters had a clear lens as a base substrate.

TABLE 1

Transmissivities of a Deposited Submicrometric Coating on a Lens.

| Process Parameters | Transmissivity (%) | Appearance |
| --- | --- | --- |
| Clear lens* | 88.45 | Clear |
| Neutral density lens* | 72.27 | Light green tint |
| 6 sec at 11 kW on clear lens | 81.18 | Light smokey |
| 6 sec at 20 kW on clear lens | 54.10 | Medium smokey |
| 9 sec at 20 kW on clear lens | 43.12 | Dark smokey |
| 12 sec at 20 kW on clear lens | 30.11 | Darker smokey |
| 18 sec at 20 kW on clear lens | 17.52 | Metallic |
| 24 sec at 20 kW on clear lens | 10.84 | Metallic, mirror-like |
| 36 sec at 20 kW on clear lens | 4.72 | Opaque |

*No coating is present - used as a standard transmissivity reference

FIG. 2 (and Table 1) can also be extrapolated for using a neutral density lens as a base substrate instead of a clear lens. For example, the neutral density lens has a transmissivity of approximately 15-16% less than the clear lens. Therefore, the graph of FIG. 2 would be shifted downward by approximately 15-16% if a neutral density lens was used as the base substrate. Other lenses can also be used as a base substrate for depositing a metallic or non-metallic submicrometric layer. Various combinations of the base substrate, processing parameters, and submicrometric material can be used to produce a wide range of appearances on a lens. An exemplary thickness of the coating on a lens can range from 10 nm to 350 nm. An exemplary power level can range from 1 kW to 60 kW. An exemplary processing time can range from three seconds to one hundred fifty seconds. An exemplary reactive gas can include acetylene, nitrogen, or oxygen.

FIG. 3A is a cross-sectional view of an exemplary vacuum chamber 100 of a magnetron sputtering apparatus for practicing embodiments described herein. A filament 110 provides a filament generated plasma 115 within the vacuum chamber 100, via a discharge power supply 120.

A rotary worktable 125 is driven by a driving motor 130 by means of a rotating shaft 135. A plurality of samples 140, such as substrates is affixed to sides of the rotary worktable 125. However, a single sample 140 could be present on the rotary worktable 125. FIG. 1A also illustrates a process gas port 145 and a reactive gas port 150.

Vacuum chamber 100 also illustrates a first sputtering target apparatus 155 and a second sputtering target apparatus 160. Each sputtering target apparatus 155 and 160 works in conjunction with a respective first independent sputtering target power supply 10a and a second independent sputtering target power supply 10b. The first and second independent sputtering target power supplies 10a and 10b are configured to operate independently. As a result, the first and second independent sputtering target power supplies 10a and 10b can operate at different power levels and at different sputtering frequencies. In addition, the first and second independent sputtering target power supplies 10a and 10b can sputter simultaneously or alternately.

Each sputtering target apparatus 155 and 160 includes a respective first magnetron 15a and a second magnetron 15b, each of which includes a plurality of magnets. A first target 20a and a second target 20b are attached to their respective magnetrons 15a and 15b, via a respective first backing plate 25a and a second backing plate 25b. Targets 20a and 20b can be the same target material or a different target material. Embodiments herein describe sputtering a first target material 20a that combines with a specified reactive gas and sputtering a different second target material 20b that combines with the same or a different reactive gas to form a coating on the samples 140.

A first magnetron generated plasma 30a and a second magnetron generated plasma 30b are formed between the respective targets 20a and 20b and the samples 140 during operation of the magnetron sputtering apparatus. First magnetic fields 35a and second magnetic fields 35b are also generated during operation of the magnetron sputtering apparatus. Target material is sputtered from the respective targets 20a and 20b towards the samples 140 during operation of the magnetron sputtering apparatus. Rotation of the samples 140, via the rotary worktable 125 provides a uniform coating onto the samples 140.

FIG. 3A illustrates a first sputtering target apparatus 155 and a second sputtering target apparatus 160. However, embodiments described herein encompass a vacuum chamber 100 in which only one sputtering target apparatus 155 or 160 is included.

Figure 3B:
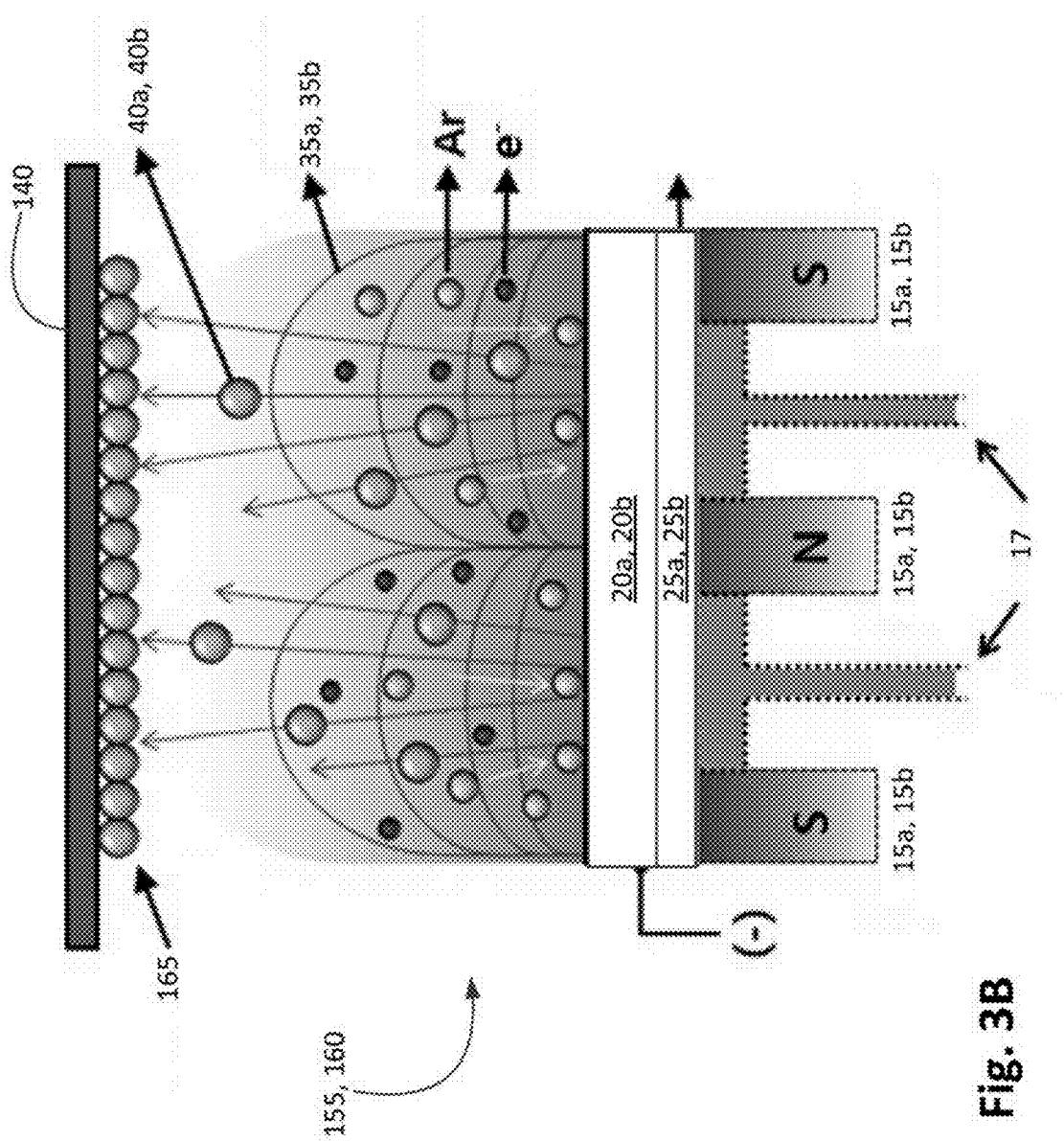
FIG. 3B illustrates a perspective view of an exemplary sputtering target apparatus according to one embodiment.

FIG. 3B illustrates a perspective view of the first sputtering target apparatus 155, which can also be the second sputtering target apparatus 160. Targets 20a (20b) are affixed to their respective backing plates 25a (25b) and onto their respective magnetrons 15a (15b). Cooling channels 17 provide a mechanism to cool the magnetrons 15a (15b) using water for example, or some other coolant. Magnetic fields 35a (35b) are generated during operation of the magnetron sputtering apparatus. As a result, atoms 40a (40b) are sputtered from their respective targets 20a (20b). The sputtered atoms 40a (40b) react with a specified reactive gas to form a thin film coating 165 onto the substrate sample 140.

FIG. 3B illustrates a first sputtering target apparatus 155 and a second sputtering target apparatus 160. However, embodiments described herein encompass a vacuum chamber 100 in which only one sputtering target apparatus 155 or 160 is included.

FIG. 4 is a block diagram illustrating a vacuum chamber 200 of a magnetron sputtering apparatus according to embodiments described herein. Vacuum chamber 200 includes a platform 210, such as a reel platform in which a part is placed during a sputtering deposition process. A reactive gas port 220 introduces a reactive gas into the vacuum chamber 200 during the sputtering deposition process. A process gas port 230 introduces process gas/gases into the vacuum chamber 200 during the sputtering deposition process.

Vacuum chamber 200 includes a first independent sputtering target power supply 240, which controls the power used for the sputtering of an associated first target material. Vacuum chamber 200 also includes a second independent sputtering target power supply 250, which controls the power used for the sputtering of an associated second target material. However, embodiments described herein also encompass a vacuum chamber 200 having just one power supply and one target material.

The first independent sputtering target power supply 240 and the second independent sputtering target power supply 250 are connected by a switch 260. The switch 260 is configured to alternate power supplied to the first independent sputtering target power supply 240 and the second independent sputtering target power supply 250. The sputtered material from the first target material and the second target material may or may not chemically react with a reactive gas (or non-reactive process gas) introduced into the vacuum chamber 200, via the gas port 220. The chemically-reacted composition adheres to the part located on the reel platform 210.

The vacuum chamber 200 illustrated in FIG. 4 is not drawn to scale, and the layout of the components located therein may differ from an actual vacuum chamber. In an example, platform 210 is centrally located such that the sputtered materials and the reactant gas have adequate time to chemically react prior to coating the part mounted on the platform 210. Air flow ducts may be present to assist in completely and adequately coating the mounted part.

FIG. 4 is given for illustrative purposes only and does not include all components of a vacuum chamber 200. In addition, more than two power supplies associated with more than two target materials in vacuum chamber 200 are contemplated by embodiments described herein.

FIG. 4 also includes a bus 270 having processing circuitry configured to execute embodiments as described herein. Bus 270 is illustrated as a separate component from vacuum chamber 200 but connected to vacuum chamber 200 via a circuitry bus 265 for transmitting and receiving communication signals between the vacuum chamber 200 and the bus 270 during a reactive sputtering process. In another embodiment, bus 270 is an integral component of vacuum chamber 200.

Bus 270 controls the execution of the reactive sputtering process. Power supply$_1$ circuitry 271 connected to bus 270 controls execution of power supply$_1$ 240, such as the power level of power supply$_1$ 240. Power supply$_2$ circuitry 272 connected to bus 270 controls execution of power supply$_2$ 250, such as the power level of power supply$_2$ 250. Switch circuitry 273 connected to bus 270 controls alternation of power supply activation between power supply$_1$ 240 and power supply$_2$ 250. Switch circuitry 273 determines the length of time of activation alternating between power supply$_1$ 240 and power supply$_2$ 250. In one embodiment, the length of time for a single activation of power supply$_1$ 240 and power supply$_2$ 250 is the same. In another embodiment, the length of time for a single activation of power supply$_1$ 240 and power supply$_2$ 250 is different. In an example, the length of time for activation of either power supply$_1$ 240 or power supply$_2$ 250 during alternation of power supplies can be in a time range of approximately 10-500 milliseconds.

Embodiments described herein also encompass a vacuum chamber 200 having just one power supply. Therefore, there would be just one power supply circuitry with no switch and no switch circuitry.

Reactive gas port circuitry 274 is also connected to bus 270. Reactive gas port circuitry 274 is configured to control the flow of reactant gas into the vacuum chamber 200. Control parameters include, but are not limited to reactant gas flow rate, length of time of reactant gas flow rate, and introduction or mixture of more than one reactant gas.

Process gas port circuitry 275 is also connected to bus 270. Process gas port circuitry 275 is configured to control the flow of process gas into the vacuum chamber 200. Control parameters include, but are not limited to process gas flow rate, length of time of process gas flow rate, and introduction of more than one process gas. Bus 270 controls the interaction and timing of reactive gas port circuitry 274 and process gas port circuitry 275.

Embodiments described herein with reference to FIG. 1 describe a lens 20 that is partially metallized with a sputter-deposited submicrometric coating 30, such as stainless steel. The sputter-deposited submicrometric coating 30 is very thin and therefore, is porous and does not block light rays from traveling through the lens 20 when a light source behind the lens 20 is activated.

Figure 5A:
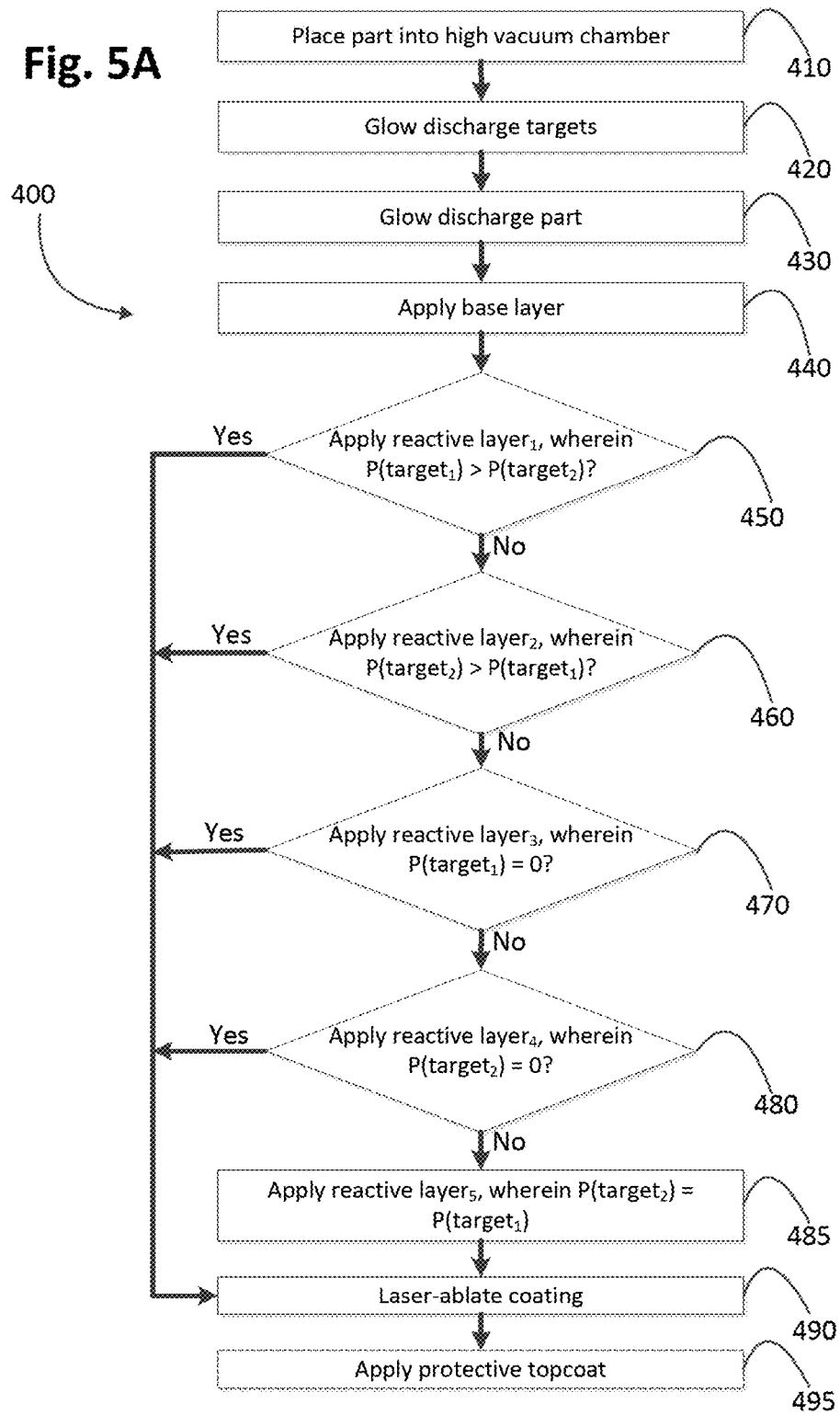
FIG. 5A is an exemplary algorithm for a process of coating a substrate using reactive sputtering according to one embodiment.

An alternative embodiment for a partial submicrometric metal coating formed on a lens 20 or other substrate is described herein with reference to FIG. 5A. The metal ceramic or metal nitride coated substrate described by the algorithm of FIG. 5 can include a subsequent process of laser ablation in which the metal ceramic or metal nitride coating becomes porous. As a result, light rays are able to traverse through a first side of the substrate when a light source behind the substrate is activated. In addition, a second side (the exterior side) of the substrate maintains the appearance of a metal ceramic surface when the light source behind the substrate is deactivated. Therefore, a laser-ablated metal ceramic coated substrate produced by the algorithm of FIG. 5 is also encompassed by embodiments described herein for a partially metallized coating.

FIG. 5A is an exemplary algorithm 400 for a process of coating a substrate via reactive sputtering using a magnetron sputtering apparatus with vacuum chamber 100 or 200. In step 410, a substrate is placed into the high vacuum chamber of the magnetron sputtering apparatus for application of a sputtered coating onto the substrate. In one embodiment, the substrate can be an automotive part and in particular, the substrate can be a component of an automotive lamp. In a second embodiment, the substrate can be made of plastic and in particular, the substrate can be made of polycarbonate or high-temperature polycarbonate, PMMA, glass, PET, etc.

In step 420, targets within the vacuum chamber are exposed to a glow discharge to remove oxides and/or other contaminants from the targets. In an example, multiple targets can be present within the vacuum chamber.

In step 430, the substrate is exposed to a glow discharge to remove any gases from the substrate. In addition, the glow discharge roughens the surface of the substrate.

In step 440, a base layer is applied. In one embodiment, the base layer includes a titanium layer or an aluminum layer. However, the base layer can include other components in which the base layer is a soft metal layer that adheres to the substrate to a subsequent sputtered coating. In one embodiment, the base layer is approximately 10-30 nm thick.

In step 450, it is determined whether a reactive layer$_1$ is applied to the substrate, wherein a sputtering power level of target$_1$ is greater than a sputtering power level of target$_2$. The reactive layer$_1$ is formed using a reactive gas, such as nitrogen. A process gas, such as argon is also introduced into the vacuum chamber. The reactive layer$_1$ is formed by alternately sputtering target$_1$ and target$_2$, which reacts with the reactive gas to form a sputtered coating onto the substrate in the vacuum chamber. When the sputtering power level of target$_1$ is greater than the sputtering power level of target$_2$, a greater amount of target$_1$ is present in the sputtered coating. For example, when target$_1$ is titanium and target$_2$ is aluminum and the reactive gas is nitrogen, the sputtered coating includes a non-stoichiometric $Ti_xAl_yN_z$ layer, wherein x is greater than y, and z designates an amount of nitrogen in the coating. Nitrogen provides a hard sputtered coating. Therefore, the hardness can be increased by increasing the amount of nitrogen. The addition of nitrogen leads to formation of a hard nitride layer. The hardness of the coating can be increased by increasing the thickness of the reactive layer.

If reactive layer$_1$ is not applied to the substrate (a "NO" decision in step 450), it is determined whether a reactive layer$_2$ is applied to the substrate in step 460, wherein a sputtering power level of target$_2$ is greater than a sputtering power level of target$_1$. When the sputtering power level of target$_2$ is greater than the sputtering power level of target$_1$, a greater amount of target$_2$ is present in the sputtered coating. For example, when target$_1$ is titanium and target$_2$ is aluminum and the reactive gas is nitrogen, the sputtered coating includes a non-stoichiometric $Ti_xAl_yN_z$ layer, wherein y is greater than x.

If reactive layer$_2$ is not applied to the substrate (a "NO" decision in step 460), it is determined whether a reactive layer$_3$ is applied to the substrate in step 470, wherein a sputtering power level of target$_1$ is zero. In step 470, only one target is sputtered to react with a reactant gas to form the sputtered coating. For example, when target$_2$ is aluminum and the reactive gas is nitrogen, the sputtered coating includes an AlN layer.

If reactive layer$_3$ is not applied to the substrate (a "NO" decision in step 470), a reactive layer$_4$ is applied to the substrate in step 480, wherein a sputtering power level of target$_2$ is zero. In step 480, only one target is sputtered to react with a reactant gas to form the sputtered coating. For example, when target$_1$ is titanium and the reactive gas is nitrogen, the sputtered coating includes a TiN layer.

In step 485, a reactive layer$_5$ is applied to the substrate when the P(target$_1$)=P(target$_2$). When both targets are powered equally, a resulting composition is $Ti_xAl_yN_z$, where x and y are equal.

In step 490, the final reactive layer is laser-ablated to create pores within the reactive layer, which will be reactive layer$_1$, reactive layer$_2$, reactive layer$_3$, reactive layer$_4$, or reactive layer$_5$. The laser ablation is applied to reactive layer$_1$ when step 450 is determined to be "YES." The laser ablation is applied to reactive layer$_2$ when step 460 is determined to be "YES." The laser ablation is applied to reactive $layer_3$ when step 470 is determined to be "YES." The laser ablation is applied to reactive $layer_4$ when step 470 is determined to be "NO." The laser ablation is applied to reactive $layer_5$ when step 480 is determined to be "NO."

The degree of laser ablation is predetermined based upon a desired transmissivity of light through the coated substrate. The degree of transmissivity is illustrated in FIG. 2 and Table 1, wherein a greater amount of laser ablation is created when a high transmissivity of light is desired and a lesser amount of laser ablation is created when a low transmissivity of light is desired.

In step 495, a protective topcoat is applied to the sputtered coating as an optional step. In one embodiment, the protective topcoat is a siloxane material, such as hexymethyldisiloxane (HMDSO). Tetramethyldisiloxane (TMDSO) is another siloxane material that can be used as a protective topcoat with embodiments described herein. HMDSO and TMDSO are described in the published patent CA 2294658C, which is incorporated in its entirety by reference herein. However, other materials that provide a clear protective coating to the reactive sputtered coating and provide protection from a harsh automotive lamp environment can be used for a protective topcoat.

The algorithm 400 of FIG. 5A is illustrated using a first target material of titanium and a second target material of aluminum. However, other materials can be used in embodiments described herein. For example, the first target material can be copper and the second target material can be aluminum. When a nitrogen reactive gas is used, $reactive\ layer_1$ provides a sputtered coating of nonstoichiometric $Cu_xAl_yN_z$, wherein x is greater than y. When a nitrogen reactive gas is used, $reactive\ layer_2$ provides a sputtered coating of nonstoichiometric $Cu_xAl_yN_z$, wherein y is greater than x. When a nitrogen reactive gas is used, $reactive\ layer_3$ provides a sputtered coating of AlN. When a nitrogen reactive gas is used, $reactive\ layer_4$ provides a sputtered coating of CuN.

Embodiments are also described herein in which a reactive gas other than nitrogen is used. For example, acetylene and oxygen can be used or a combination of nitrogen and acetylene.

Figure 5B:
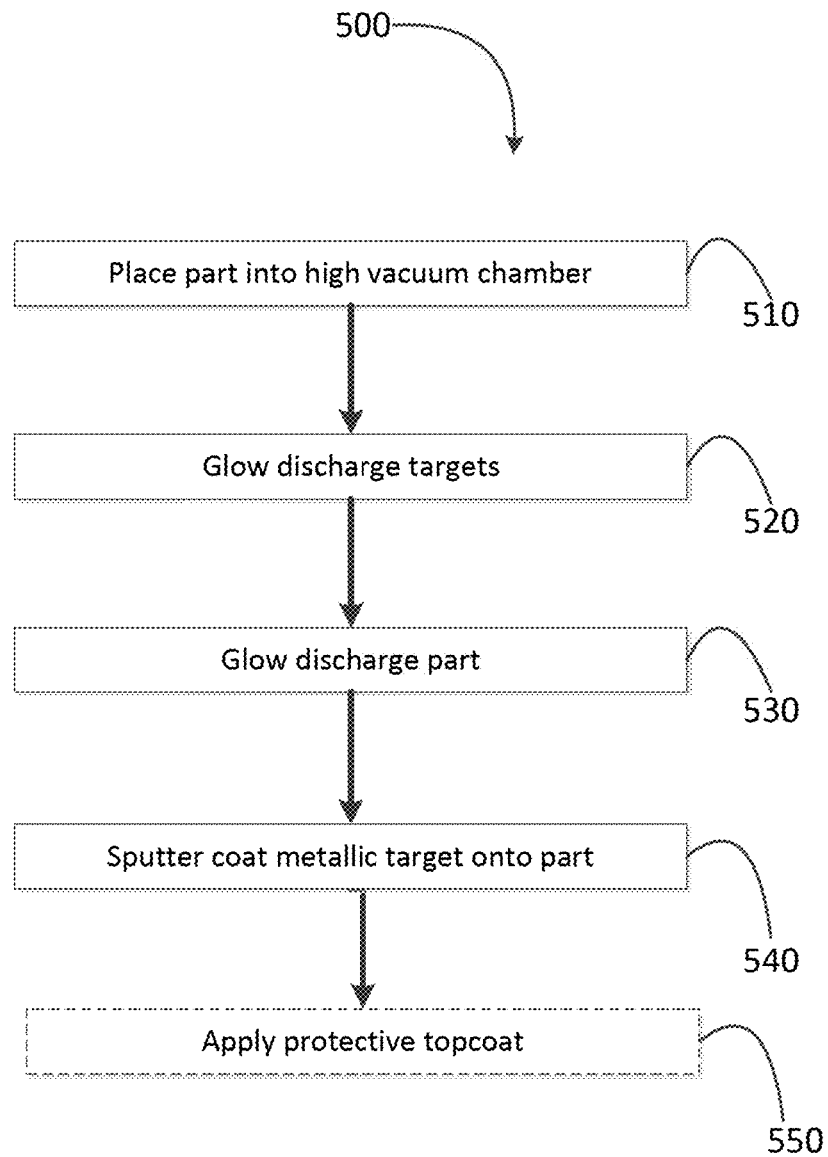
FIG. 5B is an exemplary algorithm for a process of sputter coating a substrate according to one embodiment.

FIG. 5B is an exemplary algorithm 500 for a process of sputter coating a substrate. Algorithm 500 describes a partial metallization using a metallic target with no reactive sputtering. In step 510, a substrate is placed into the high vacuum chamber of the magnetron sputtering apparatus for application of a sputtered coating onto the substrate. In one embodiment, the substrate can be an automotive part and in particular, the substrate can be a component of an automotive lamp. In a second embodiment, the substrate can be made of plastic and in particular, the substrate can be made of polycarbonate or high-temperature polycarbonate, PMMA, glass, PET, etc.

In step 520, targets within the vacuum chamber are exposed to a glow discharge to remove oxides and/or other contaminants from the targets. In an example, multiple targets can be present within the vacuum chamber.

In step 530, the substrate is exposed to a glow discharge to remove any gases from the substrate. In addition, the glow discharge roughens the surface of the substrate.

In step 540, a metallic target is sputter-coated onto the part. In one embodiment, the metallic target is stainless steel. In algorithm 500, the metallic target is not reactively sputter-coated onto the part. Therefore, there is no reactive gas introduced into the vacuum chamber. A process gas is introduced into the vacuum chamber to enable the sputtering process.

Various combinations of processing times and processing powers can be utilized in step 540, as illustrated in FIG. 2 and Table 1. When a clear lens is used as the base part or substrate, a smokey appearance can be obtained using lower powers and lower processing times. A metallic appearance can be obtained using higher powers and higher processing times. When a neutral density lens is used as the base part or substrate, the processing power and/or time is reduced by approximately 15-16% to achieve the same appearance as illustrated in FIG. 2 and Table 1.

In step 550, an optional protective topcoat can be applied to the sputtered partial metallization layer. In one embodiment, the protective topcoat is made from a disoloxane monomer, such as HMDSO or TMDSO. In one embodiment, the protective topcoat is not necessary when a stainless steel sputter coating is applied onto the part.

A hardware description of an exemplary computing device 600 used in accordance with embodiments herein is described with reference to FIG. 6. Computing device 600 can be used with the vacuum chamber 100 or 200 of a magnetron sputtering apparatus and associated bus 270.

Computing device 600 is intended to represent various forms of digital hardware, such as laptops, desktops, workstations, personal digital assistants, servers, blade servers, mainframes, and other appropriate computers. The components shown here, their connections and relationships, and their functions are meant to be examples only and are not meant to be limiting.

The computing device 600 includes a processor 601, a memory 602, a storage device 604, a high-speed interface 612 connecting to the memory 602 and multiple high-speed expansion ports 616, and a low-speed interface 610 connecting to a low-speed expansion port 614 and the storage device 604. Each of the processor 601, the memory 602, the storage device 604, the high-speed interface 612, the high-speed expansion ports 616, and the low-speed interface 610 are interconnected using various busses, such as communication bus 626, and may be mounted on a common motherboard or in other manners as appropriate.

The processor 601 can process instructions for execution within the computing device 600, including instructions stored in the memory 602 or on the storage device 604 to display graphical information for a GUI on an external input/output device, such as a display 608 coupled to the high-speed interface 612. In other implementations, multiple processors and/or multiple buses may be used, as appropriate, along with multiple memories and types of memory. Also, multiple computing devices may be connected, with each device providing portions of the necessary operations (e.g., as a server bank, a group of blade servers, or a multi-processor system). The memory 602 stores information within the computing device 600. In some implementations, the memory 602 is a volatile memory unit or units. In some implementations, the memory 602 is a non-volatile memory unit or units. The memory 602 can also be another form of computer-readable medium, such as a magnetic or optical disk.

The storage device 604 is capable of providing mass storage for the computing device 600. In some implementations, the storage device 604 can be or contain a computer-readable medium, such as a floppy disk device, a hard disk device, an optical disk device, a tape device, a flash memory or other similar solid state memory device, or an array of devices, including devices in a storage area network or other configurations. Instructions can be stored in an information carrier. The instructions, when executed by one or more processing devices (for example, processor 601), perform one or more methods, such as those described above. The instructions can also be stored by one or more storage devices, such as computer- or machine-readable mediums (for example, the memory 602, the storage device 604, or memory on the processor 601).

The high-speed interface 612 manages bandwidth-intensive operations for the computing device 600, while the low-speed interface 610 manages lower bandwidth-intensive operations. Such allocation of functions is an example only. In some implementations, the high-speed interface 612 is coupled to the memory 602, the display 608 (e.g., through a graphics processor or accelerator), and to the high-speed expansion ports 616, which may accept various expansion cards (not shown). In the implementation, the low-speed interface 610 is coupled to the storage device 604 and the low-speed expansion port 614. The low-speed expansion port 614, which can include various communication ports (e.g., USB, Bluetooth, Ethernet, wireless Ethernet) can be coupled to one or more input/output devices 618, such as a keyboard, a pointing device, a scanner, or a networking device such as a switch or router, e.g., through a network adapter.

The computing device 600 also includes a network controller 606, such as an Intel Ethernet PRO network interface card from Intel Corporation of America, for interfacing with a network 99. As can be appreciated, the network 99 can be a public network, such as the Internet, or a private network such as an LAN or WAN network, or any combination thereof and can also include PSTN or ISDN sub-networks. The network 99 can also be wired, such as an Ethernet network, or can be wireless such as a cellular network including EDGE, 3G, 4G, and 5G wireless cellular systems. The wireless network can also be Wi-Fi, Bluetooth, or any other wireless form of communication that is known.

Figure 6:
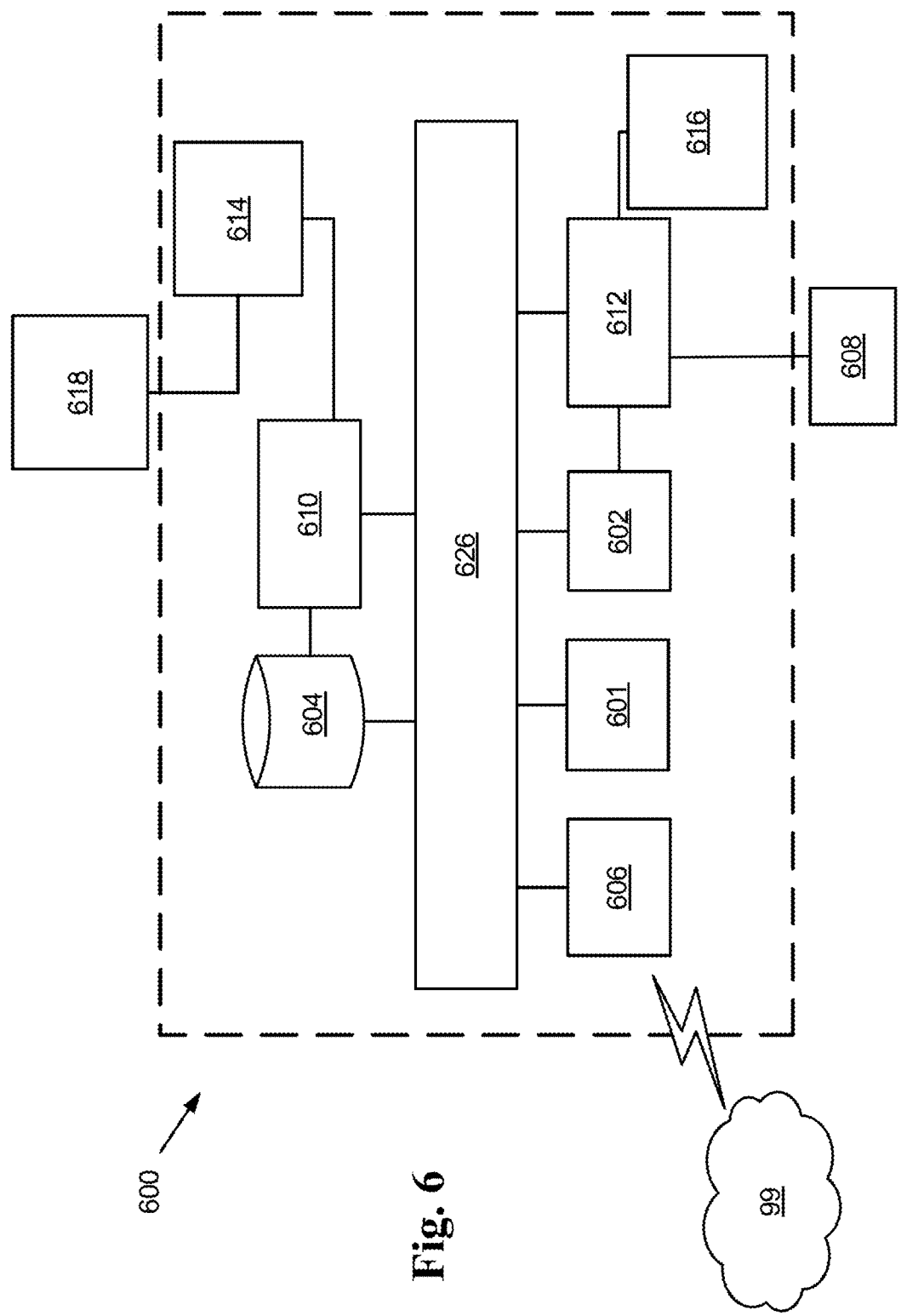
FIG. 6 is a block diagram of an exemplary computing device according to one embodiment.

Although the computing device 600 of FIG. 6 is described as having a storage medium device 604, the claimed advancements are not limited by the form of the computer-readable media on which the instructions of the described processes are stored. For example, the instructions can be stored on CDs, DVDs, in FLASH memory, RAM, ROM, PROM, EPROM, EEPROM, hard disk, or any other information processing device with which the computing device communicates.

In other alternate embodiments, processing features according to the present disclosure may be implemented and commercialized as hardware, a software solution, or a combination thereof. Moreover, instructions corresponding to processes described herein could be stored in a portable drive, such as a USB Flash drive that hosts a secure process.

Computer programs (also known as programs, software, software applications, or code) associated with the processes described herein include machine instructions for a programmable processor, and can be implemented in a high-level procedural and/or object-oriented programming language, and/or in assembly/machine language. As used herein, the terms machine-readable medium and computer-readable medium refer to any computer program product, apparatus, and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term machine-readable signal refers to any signal used to provide machine instructions and/or data to a programmable processor.

To provide for interaction with a user, the systems and techniques described herein can be implemented on a computer having a display device 608 (e.g., a CRT (cathode ray tube) or LCD (liquid crystal display) monitor) for displaying information to the user and a keyboard and a pointing device 618 (e.g., a mouse or a trackball) by which the user can provide input to the computer. Other kinds of devices can be used to provide for interaction with a user as well. For example, feedback provided to the user can be any form of sensory feedback (e.g., visual feedback, auditory feedback, or tactile feedback), and input from the user can be received in any form, including acoustic, speech, or tactile input.

The systems and techniques described herein can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network (LAN), a wide area network (WAN), and the Internet.

The computing system can include clients and servers. A client and server are generally remote from each other and typically interact through a communication network. The relationship of client and server arises by virtue of computer programs running on the respective computers and having a client-server relationship to each other.

Figure 7:
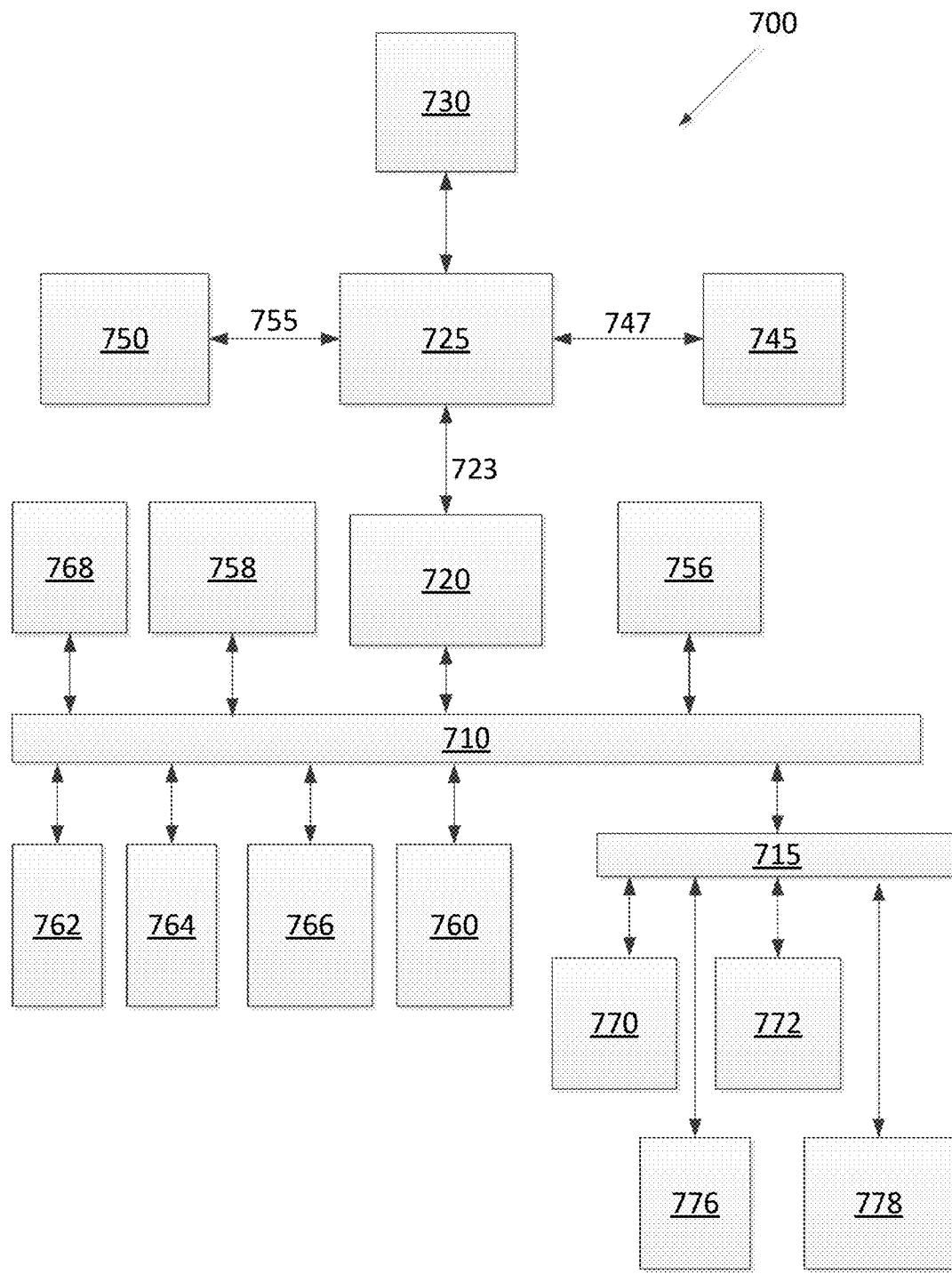
FIG. 7 is a schematic diagram of an exemplary data processing system according to one embodiment.

FIG. 7 shows a schematic diagram of an exemplary data processing system, according to aspects of the disclosure described herein for performing menu navigation, as described above. The data processing system is an example of a computer in which code or instructions implementing the processes of the illustrative embodiments can be located.

In FIG. 7, data processing system 700 employs an application architecture including a north bridge and memory controller hub (NB/MCH) 725 and a south bridge and input/output (I/O) controller hub (SB/ICH) 720. The central processing unit (CPU) 730 is connected to NB/MCH 725. The NB/MCH 725 also connects to the memory 745 via a memory bus 747, and connects to the graphics processor 750 via an accelerated graphics port (AGP) 755. The NB/MCH 725 also connects to the SB/ICH 720 via an internal bus 723 (e.g., a unified media interface or a direct media interface). The CPU 730 can contain one or more processors and even can be implemented using one or more heterogeneous processor systems.

Figure 8:
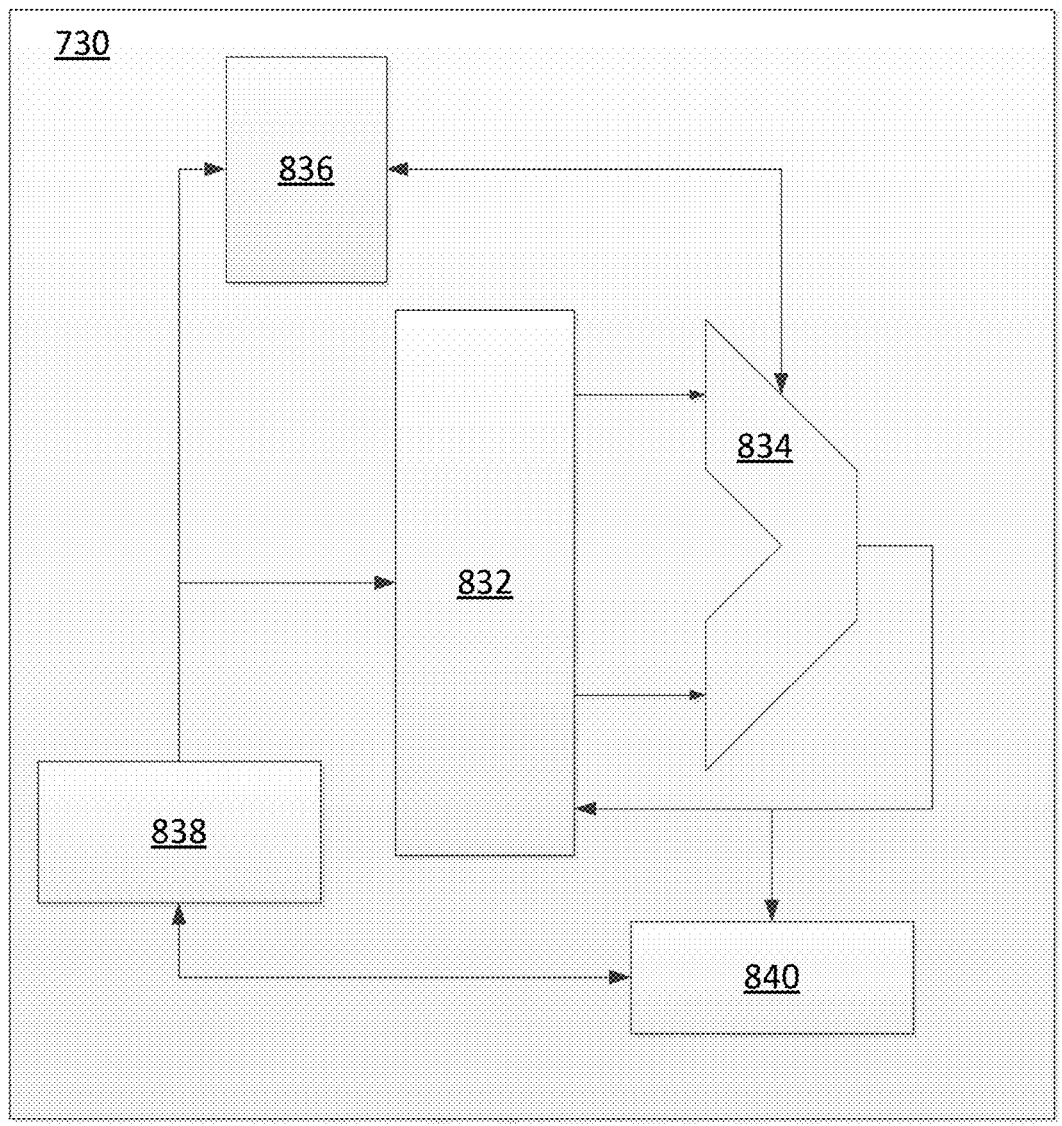
FIG. 8 illustrates one implementation of a central processing unit (CPU) according to one embodiment.

For example, FIG. 8 illustrates one implementation of CPU 730. In one implementation, an instruction register 838 retrieves instructions from a fast memory 840. At least part of these instructions are fetched from an instruction register 838 by a control logic 836 and interpreted according to the instruction set architecture of the CPU 730. Part of the instructions can also be directed to a register 832. In one implementation the instructions are decoded according to a hardwired method, and in another implementation the instructions are decoded according to a microprogram that translates instructions into sets of CPU configuration signals that are applied sequentially over multiple clock pulses.

After fetching and decoding the instructions, the instructions are executed using an arithmetic logic unit (ALU) 834 that loads values from the register 832 and performs logical and mathematical operations on the loaded values according to the instructions. The results from these operations can be fed back into the register 832 and/or stored in a fast memory 840. According to aspects of the disclosure, the instruction set architecture of the CPU 730 can use a reduced instruction set computer (RISC), a complex instruction set computer (CISC), a vector processor architecture, or a very long instruction word (VLIW) architecture. Furthermore, the CPU 730 can be based on the Von Neuman model or the Harvard model. The CPU 730 can be a digital signal processor, an FPGA, an ASIC, a PLA, a PLD, or a CPLD. Further, the CPU 730 can be an x86 processor by Intel or by AMD; an ARM processor; a Power architecture processor by, e.g., IBM; a SPARC architecture processor by Sun Microsystems or by Oracle; or other known CPU architectures.

Referring again to FIG. 7, the data processing system 700 can include the SB/ICH 720 being coupled through a system bus 710 to an I/O Bus 715, a read only memory (ROM) 756, universal serial bus (USB) port 764, a flash binary input/output system (BIOS) 768, and a graphics controller 758. PCI/PCIe devices can also be coupled to SB/ICH 720 through a PCI bus 762.

The PCI devices can include, for example, Ethernet adapters, add-in cards, and PC cards for notebook computers. The Hard disk drive 760 and CD-ROM 766 can use, for example, an integrated drive electronics (IDE) or serial advanced technology attachment (SATA) interface. In one implementation the I/O bus 715 can include a super I/O (SIO) device.

Further, the hard disk drive (HDD) 760 and optical drive 766 can also be coupled to the SB/ICH 720 through the system bus 710. In one implementation, a keyboard 770, a mouse 772, a parallel port 778, and a serial port 776 can be connected to the system bus 710 through the I/O bus 715. Other peripherals and devices can be connected to the SB/ICH 720 using a mass storage controller such as SATA or PATA, an Ethernet port, an ISA bus, a LPC bridge, SMBus, a DMA controller, and an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry, or based on the requirements of the intended back-up load to be powered.

The functions and features described herein can also be executed by various distributed components of a system. For example, one or more processors can execute these system functions, wherein the processors are distributed across multiple components communicating in a network. The distributed components can include one or more client and server machines, which can share processing, such as a cloud computing system, in addition to various human interface and communication devices (e.g., display monitors, smart phones, tablets, personal digital assistants (PDAs)). The network can be a private network, such as a LAN or WAN, or can be a public network, such as the Internet. Input to the system can be received via direct user input and received remotely either in real-time or as a batch process. Additionally, some implementations can be performed on modules or hardware not identical to those described. Accordingly, other implementations are within the scope that can be claimed.

The functions and features described herein may also be executed by various distributed components of a system. For example, one or more processors may execute these system functions, wherein the processors are distributed across multiple components communicating in a network. For example, distributed performance of the processing functions can be realized using grid computing or cloud computing. Many modalities of remote and distributed computing can be referred to under the umbrella of cloud computing, including: software as a service, platform as a service, data as a service, and infrastructure as a service. Cloud computing generally refers to processing performed at centralized locations and accessible to multiple users who interact with the centralized processing locations through individual terminals.

Embodiments described herein can be implemented in conjunction with one or more of the devices described above with reference to FIGS. 6-8. Embodiments are a combination of hardware and software, and processing circuitry by which the software is implemented.

Figure 9:
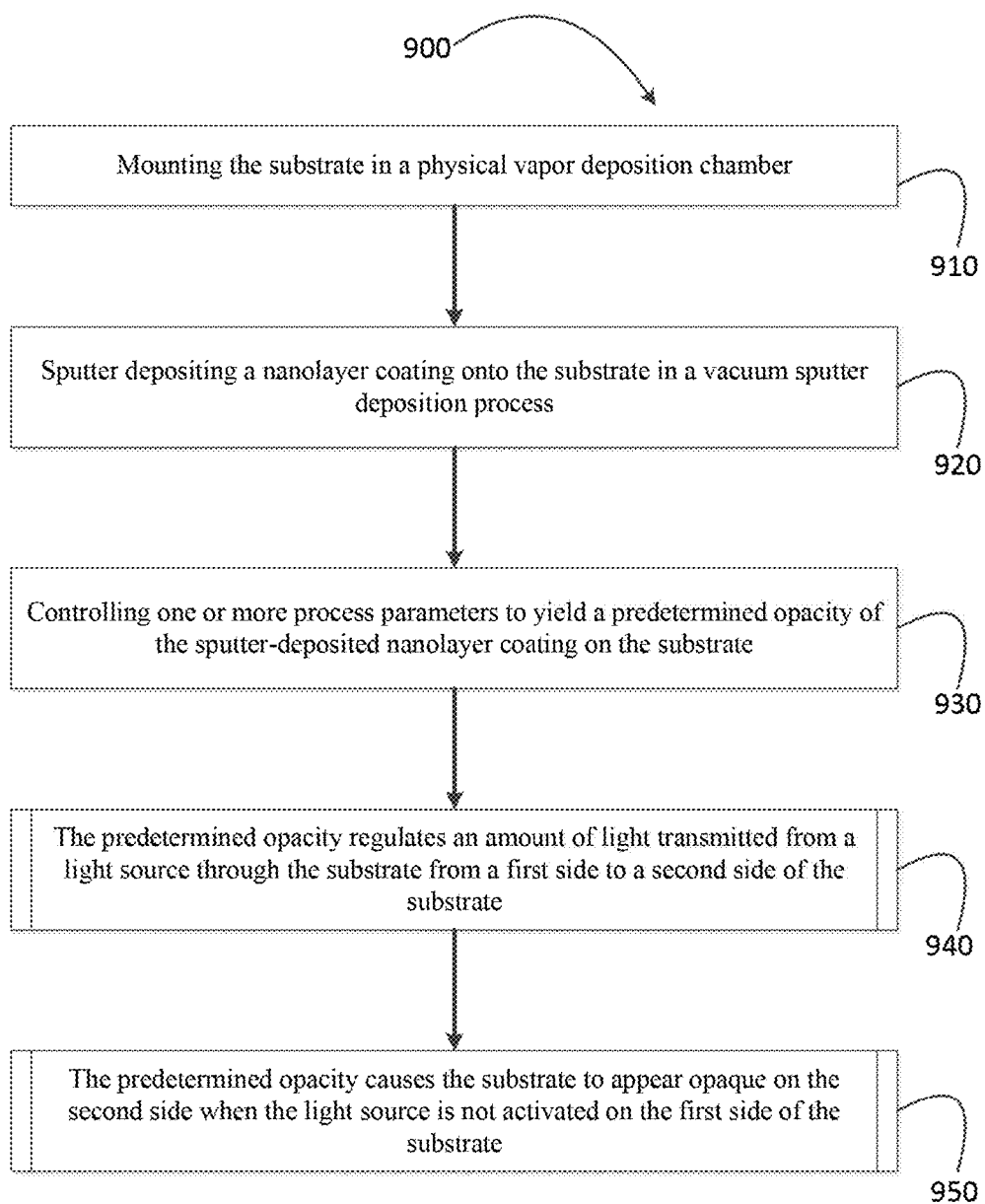
FIG. 9 is a flowchart for an exemplary method of partially metallizing a substrate according to one embodiment.

FIG. 9 is a flowchart for an exemplary method 900 of depositing a coating onto a substrate. In step 910, the substrate is mounted in a physical vapor deposition (PVD) chamber.

In step 920, a coating having a submicrometric layer thickness is sputter deposited onto the substrate in a vacuum sputter deposition process. In an example, stainless steel is sputter deposited onto the substrate.

In step 930, one or more process parameters are controlled to yield a predetermined absorbance of the sputter-deposited submicrometric coating on the substrate. The predetermined absorbance regulates an amount of light transmitted from a light source through the substrate from a first side to a second side of the substrate. The predetermined absorbance causes the substrate to appear opaque on the second side when the light source is deactivated on the first side of the substrate. A thickness of the sputter-deposited coating can be controlled to achieve a full range of light absorbance from a light absorbance of zero percent to one hundred percent. An exemplary thickness of the sputter-deposited coating on the substrate can range from 10 nm to 350 nm. An exemplary power level can range from 1 kW to 60 kW. An exemplary processing time can range from three seconds to one hundred fifty seconds. An exemplary reactive gas can include acetylene, nitrogen, or oxygen.

While certain embodiments have been described herein, these embodiments are presented by way of example only, and are not intended to limit the scope of the disclosure. Using the teachings in this disclosure, a person having ordinary skill in the art can modify and adapt the disclosure in various ways, making omissions, substitutions, and/or changes in the form of the embodiments described herein, without departing from the spirit of the disclosure. Moreover, in interpreting the disclosure, all terms should be interpreted in the broadest possible manner consistent with the context. The accompanying claims and their equivalents are intended to cover such forms or modifications, as would fall within the scope and spirit of the disclosure.

The invention claimed is:

1. A method of depositing a coating onto a substrate, the method comprising:
    mounting the substrate in a physical vapor deposition (PVD) chamber;
    applying a glow discharge to the substrate prior to sputter depositing the coating having a submicrometric layer thickness;
    sputter depositing a coating having a submicrometric layer thickness onto the substrate in a vacuum sputter deposition process; and
    controlling one or more process parameters to yield a predetermined absorbance of the sputter-deposited coating on the substrate, wherein the predetermined absorbance regulates an amount of light transmitted from a light source through the substrate from a first side to a second side of the substrate, and the predetermined absorbance causes the substrate to appear opaque on the second side when the light source is deactivated on the first side of the substrate.

2. The method of claim 1, further comprising:
sputter depositing a metallic coating having a submicrometric layer thickness onto the substrate.

3. The method of claim 2, further comprising:
sputter depositing a stainless steel coating having a submicrometric layer thickness onto the substrate.

4. The method of claim 1, wherein the process parameters include a power level of a vacuum sputter deposition power source, a gas flow rate, and a deposition time of the vacuum sputter deposition process.

5. The method of claim 1, wherein one or more of the process parameters determine a color and a degree of absorbance of the substrate.

6. The method of claim 1, further comprising:
masking a portion of the substrate prior to sputter depositing the coating having a submicrometric layer thickness.

7. The method of claim 1, further comprising:
controlling one or more of the process parameters to provide the coating having a submicrometric layer thickness with a mirror-like appearance on the first side or the second side of the substrate.

8. The method of claim 1, further comprising:
controlling one or more of the process parameters to provide the coating having a submicrometric layer thickness with a smoke-like appearance on the first side or the second side of the substrate.

9. The method of claim 1, further comprising:
sputter depositing a protective layer onto the substrate in a PVD process after sputter depositing the coating having a submicrometric layer thickness onto the substrate.

10. A coated substrate, comprising:
a substrate having a glow-discharged surface; and
a coating having a submicrometric layer thickness sputter deposited onto the substrate, wherein
the coating having a submicrometric layer thickness has a predetermined absorbance,
the predetermined absorbance regulates an amount of light transmitted from a light source through the substrate from a first side to a second side of the substrate,
the substrate is opaque on the second side of the substrate when the light source is deactivated on the first side of the substrate, and
the predetermined absorbance varies as a function of one or more controlled process parameters.

11. The coated substrate of claim 10, wherein the process parameters include a power level of a sputter deposition power source, a gas flow rate, and a deposition time of a sputter deposition process.

12. The coated substrate of claim 10, wherein the coating having a submicrometric layer thickness has a mirror-like appearance on the first side or the second side of the substrate.

13. The coated substrate of claim 10, wherein the coating having a submicrometric layer thickness has a smoke-like appearance on the first side or the second side of the substrate.

14. The coated substrate of claim 10, wherein one or more of the process parameters determine a color and a degree of absorbance of the substrate.

15. The coated substrate of claim 10, wherein the coating having a submicrometric layer thickness is a metallic coating having a submicrometric layer thickness.

16. The coated substrate of claim 15, wherein the coating having a submicrometric layer thickness is a stainless steel coating having a submicrometric layer thickness.

17. The coated substrate of claim 10, further comprising:
a patterned coating having a submicrometric layer thickness, wherein portions of the substrate are not covered by the coating having a submicrometric layer thickness.

18. The coated substrate of claim 10, further comprising:
a light-absorbent coating laser ablated to remove areas within the light-absorbent coating to allow light transmission through the substrate from an activated light source.

19. The coated substrate of claim 18, wherein the light-absorbent coating includes one of a laser-ablated pattern or a laser-ablated graphic.

* * * * *